United States Patent
Chen et al.

(10) Patent No.: US 10,262,895 B2
(45) Date of Patent: Apr. 16, 2019

(54) METHOD FOR FORMING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Mei-Ling Chen, Kaohsiung (TW); Wei-Hsin Liu, Changhua County (TW); Yi-Wei Chen, Taichung (TW); Chia-Lung Chang, Tainan (TW); Jui-Min Lee, Taichung (TW); Ching-Hsiang Chang, Tainan (TW); Tzu-Chin Wu, Chiayi County (TW); Shih-Fang Tzou, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 15/859,766

(22) Filed: Jan. 2, 2018

(65) Prior Publication Data

US 2018/0190658 A1 Jul. 5, 2018

(30) Foreign Application Priority Data

Jan. 3, 2017 (CN) .......................... 2017 1 0001445

(51) Int. Cl.
*H01L 21/02* (2006.01)
*H01L 21/768* (2006.01)
(Continued)

(52) U.S. Cl.
CPC .... *H01L 21/76834* (2013.01); *H01L 21/0228* (2013.01); *H01L 21/02348* (2013.01); *H01L 21/76825* (2013.01); *H01L 21/823475* (2013.01); *H01L 27/10817* (2013.01); *H01L 27/10823* (2013.01); *H01L 27/10852* (2013.01); *H01L 27/10894* (2013.01);
(Continued)

(58) Field of Classification Search
CPC ........ H01L 27/108–27/10897; H01L 21/0228; H01L 21/76834
See application file for complete search history.

(56) References Cited

U.S. PATENT DOCUMENTS

| 7,538,007 B2 | 5/2009 | Ahn | |
| 2002/0014648 A1* | 2/2002 | Mizutani | H01L 21/76807 257/306 |
| 2012/0015113 A1 | 1/2012 | Hua | |

* cited by examiner

*Primary Examiner* — Daniel P Shook
(74) *Attorney, Agent, or Firm* — Winston Hsu

(57) ABSTRACT

The present invention provides a method for fabricating a semiconductor device, comprising at least the steps of: providing a substrate in which a memory region and a peripheral region are defined, the memory region includes a plurality of memory cells, each memory cell includes at least a first transistor and a capacitor, the peripheral region compress a second transistor, a first insulating layer is formed within the memory region and the peripheral region by an atomic layer deposition process, covering the capacitor of the memory cells in the memory region and the second transistor in the peripheral region, and a second insulating layer is formed, overlying the first insulating layer and the peripheral region. Finally, a contact structure is formed within the second insulating layer, and electrically connecting the second transistor.

20 Claims, 5 Drawing Sheets

(51) Int. Cl.
*H01L 27/108* (2006.01)
*H01L 21/8234* (2006.01)
*H01L 49/02* (2006.01)

(52) U.S. Cl.
CPC ........ *H01L 27/10897* (2013.01); *H01L 28/87* (2013.01); *H01L 28/91* (2013.01); *H01L 21/0217* (2013.01); *H01L 21/02112* (2013.01); *H01L 21/02164* (2013.01)

METHOD FOR FORMING SEMICONDUCTOR DEVICE

BACKGROUND OF THE INVENTION

1. Field of the Invention

The present invention relates to the field of semiconductor manufacturing, and more particularly, to a method for solving the problem of dielectric layer fragmentation in a dynamic random access memory.

2. Description of the Prior Art

Dynamic random access memory (DRAM) is a major volatile memory and is an indispensable key element in many electronic products. DRAM consists of a large number of memory cells aggregated to form an array area for storing data. Each memory cell is composed of a metal oxide semiconductor (MOS) transistor and a capacitor in series.

The capacitor is located in a memory region, while the peripheral region is adjacent to the memory region. The peripheral region includes other transistors and contact structures. In general, the capacitors located in the memory region has greater height, so they have better charge-storage efficiency, but on the boundary between the memory region and the peripheral region, since the uneven force or capacitance height difference, the dielectric layer and the contact structures within the peripheral will be influenced.

More specifically, please refer to FIG. 1, which shows a schematic diagram of a dielectric layer and a cracked contact structure occurring in a memory region and a peripheral region of a DRAM found by the applicant. As shown in FIG. 1, a dynamic random access memory 10 is provided. The dynamic random access memory 10 includes a substrate 100, at least a memory region 102 and a peripheral region 104 are defined thereon. At least one first transistor 106 and at least one capacitor 108 are formed in the memory region 102. The peripheral region 104 also includes a plurality of second transistors 110. The first transistor 106 in the memory region 102 includes, for example, a buried word line 106a and its source/drain 106b in the substrate 100. The capacitor 108 includes a lower electrode 108a, an insulating layer 108b and an upper electrode 108c. In some embodiments, a mask structure (not shown) may be further disposed above the upper electrode 108c. However, the mask structure usually only covers the top and sidewalls of the capacitor 108, and does not cover within the peripheral region 104. Each first transistor 106 and each capacitor 108 form a memory cell 105. Between the capacitor 108 and the transistor 106, a single layer or a plurality of layers of a dielectric layer 112 and contact structures 114 may be included. The contact structures 114 connect the source/drain 106b of the first transistor 106 and the capacitor 108. In addition, a plurality of shallow trench isolation regions 116 are further included in the substrate of the memory region 102 and the peripheral region 104. In addition, the DRAM 10 herein may further include other common elements, such as bit lines, contact etch stop layers and the like. But not drawn to simplify the diagram.

Subsequently, after the capacitor 108 is formed, a dielectric layer 120 is formed on the substrate 100 to cover the memory region 102 and the peripheral region 104. At least one contact structure 122 is then formed in the dielectric layer 120, and electrically connected to the second transistor 110.

Generally speaking, the capacitor 108 is much higher than the first transistor 106 and the contact structure 114 (the height of the capacitor 108 is higher than about 1.5 micrometers), so during the manufacturing process, more portion needs to be etched by the etching process, the etching process is more difficult, and it is not easy to etch a flat sidewall. Applicants have found that in the general case, because the etching process is not easy to control, the upper electrode 108c of the capacitor 108 usually has a rough surface 109, and the rough surface 109 may apply additional stress to the dielectric layer 120. In addition, the boundary between the memory region 102 and the peripheral region 104 has a bottom corner area 124. The bottom corner area 124 is disposed between the capacitor 108 of the memory region 102 and the top of the second transistor 110 in the peripheral region 104. More specifically, the bottom corner area 124 is disposed between the insulating layer 108b and the upper electrode 108c within the memory region 102, and the dielectric layer 112 within the peripheral region 104. Since the boundary contains different components, and different components have different stresses, additional stress is easily generated at the boundary of each component to the dielectric layer 120.

As shown in FIG. 1, after the dielectric layer 120 is formed and cooled, the dielectric layer 120 may be fragmented if additional stress applies to the dielectric layer 120. In this case, the contact structure 122 is subsequently formed in the dielectric layer 120, since the dielectric layer 120 has many cracks, the conductive layer of the contact structure 122 may flow to other places through the cracks, which may cause some issues like circuit break and affects the overall DRAM yield.

Therefore, how to solve the above-mentioned crack of the dielectric layer and the disconnection of the contact structure, is one of the objectives to be solved in the present invention.

SUMMARY OF THE INVENTION

The present invention provides a method for fabricating a semiconductor device, the method including: firstly, a substrate is provided, a memory region and a peripheral region are defined thereon, the memory region comprises a plurality of memory cells, each memory cell comprises at least a first transistor and a capacitor, the peripheral region compress at least one second transistor. Next, a first insulating layer is formed within the memory region and the peripheral region by an atomic layer deposition (ALD) process, covering the capacitor of the memory cells in the memory region and the second transistor in the peripheral region. Afterwards, a second insulating layer is formed, overlying the first insulating layer. And a contact structure is formed in the second insulating layer within the peripheral region, the contact structure is electrically connected the second transistor.

The present invention further provides a method for fabricating a semiconductor device, the method including: firstly, a substrate is provided, a memory region and a peripheral region are defined thereon, the memory region comprises a plurality of memory cells, each memory cell comprises at least a first transistor and a capacitor, the peripheral region compress at least one second transistor. Next, a first insulating layer is formed within the memory region and the peripheral region, covering the capacitor of the memory cells in the memory region and the second transistor in the peripheral region, wherein the first insulating layer contains tensile stress. Afterwards, a second insulating layer is formed, overlying the first insulating layer, wherein the second insulating layer contains compressive stress. And a contact structure is formed in the second insulating layer within the peripheral region, the contact structure is electrically connected the second transistor.

A feature of the present invention is to provide some methods for resolving the problem of dielectric layer fragmentation in dynamic random access memory. One of the methods is to form the first insulating layer on the surface of the capacitor so as to repair the rough surface of the capacitor and to reduce the extra stress generated by the rough surface. Alternatively, the first insulating layer is further subjected to an ultraviolet (UV) curing process to increase the tensile stress inherent in the first insulating layer itself and counteract the compressive stress of the dielectric layer. The above two methods can avoid excessive stress affecting the dielectric layer, reduce the fragmentation of the dielectric layer and further improve the DRAM process yield.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
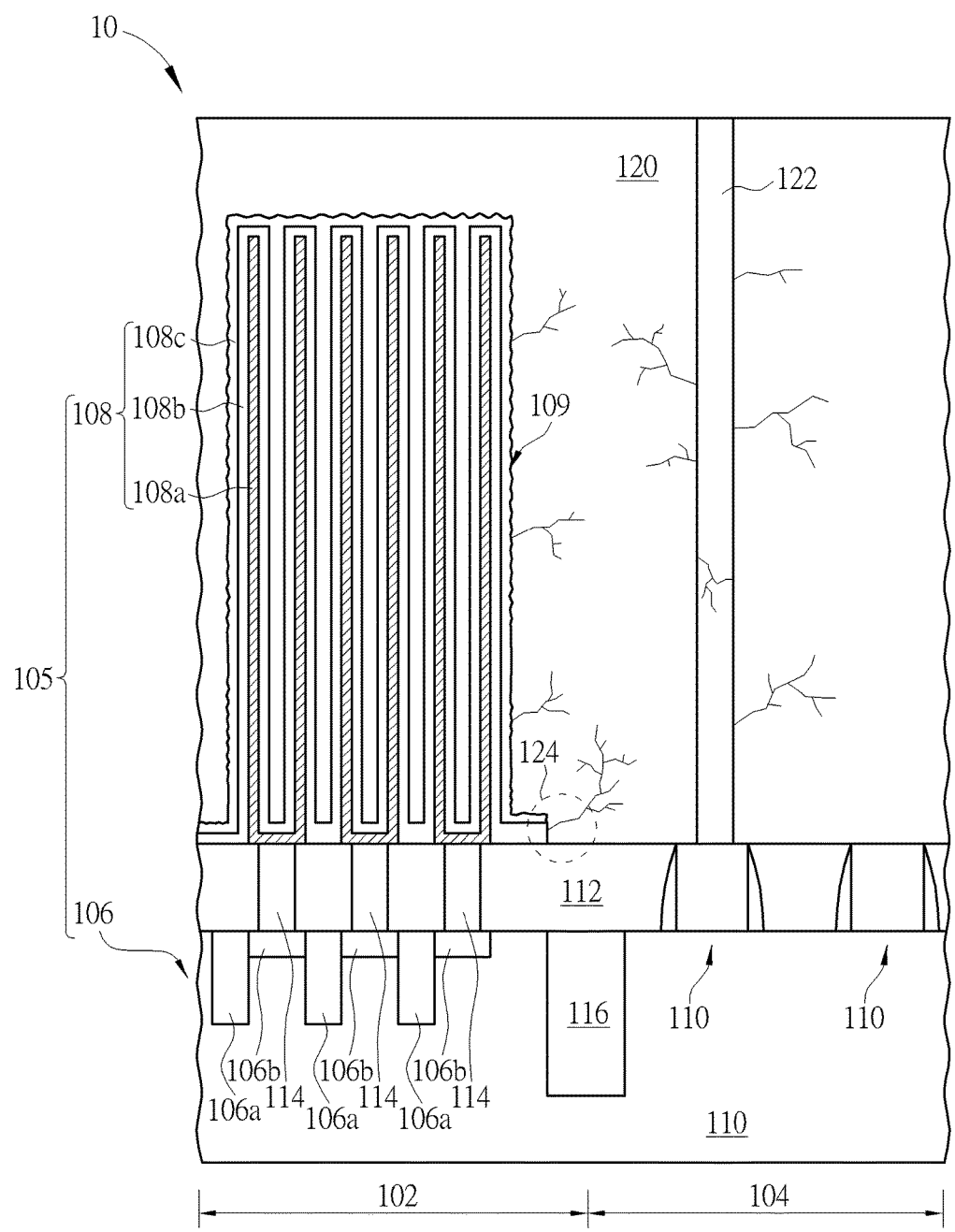
FIG. 1 shows a schematic diagram of a dielectric layer and a cracked contact structure occurring in a memory region and a peripheral region of a DRAM found by the applicant.
Figure 2:
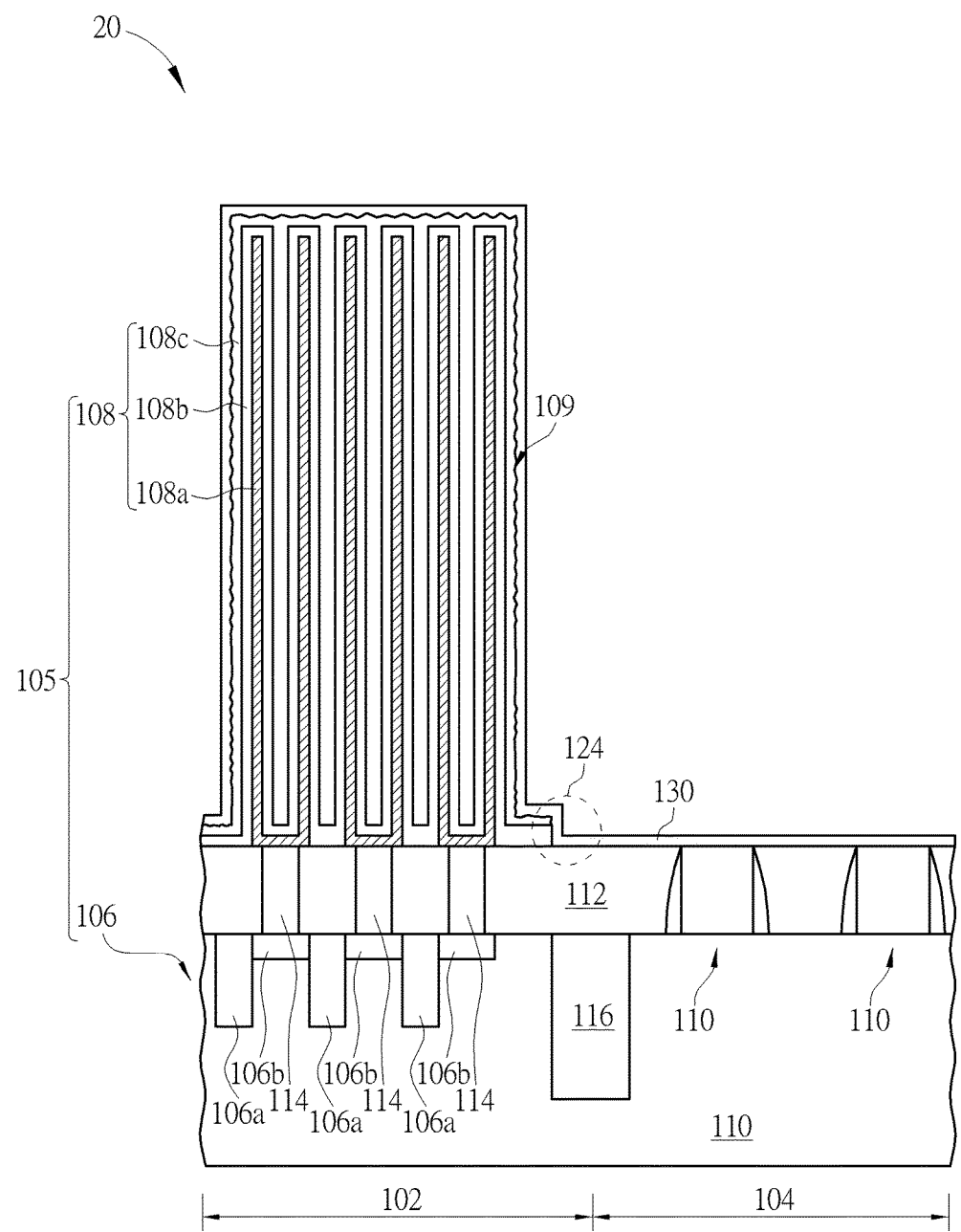
FIG. 2 and FIG. 3 show a schematic diagram of a DRAM according to a first preferred embodiment of the present invention at a boundary between a memory region and a peripheral region.
Figure 3:
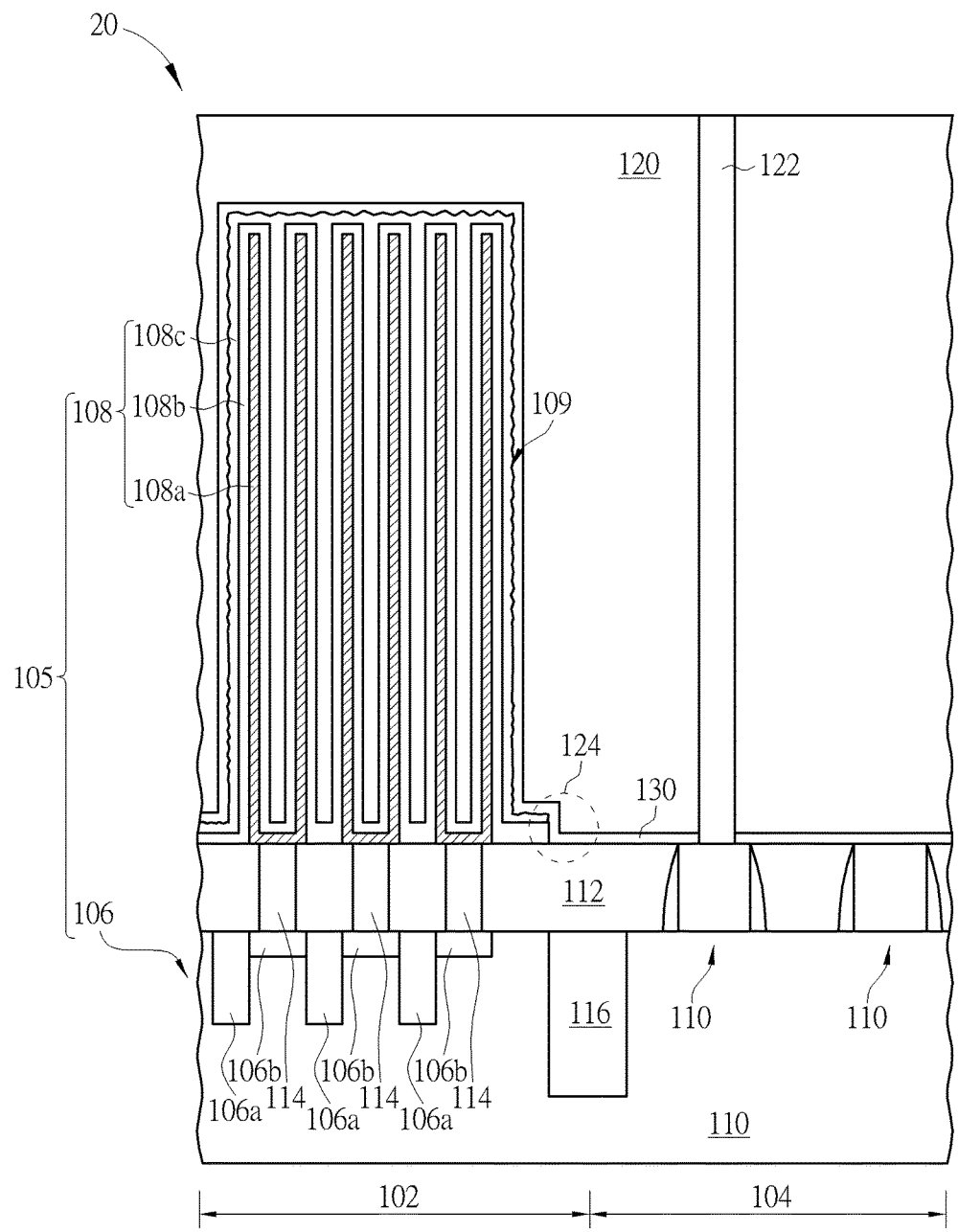

Please referring to FIG. 2 and FIG. 3, FIG. 2 and FIG. 3 show a schematic diagram of a DRAM according to a first preferred embodiment of the present invention at a boundary between a memory region and a peripheral region. First, as shown in FIG. 2, a dynamic random access memory 20 is provided. Please note that the dynamic random access memory 20 herein is based on the dynamic random access memory 10 mentioned in the prior art. Same elements are labeled as the same reference numbers. The substrate 100 includes a memory region 102 and a peripheral region 104 respectively. The memory region 102 includes at least one first transistor 106 and at least one capacitor 108. The peripheral region 104 includes at least one second transistor 110. The elements that are not mentioned here and in the following paragraphs are the same as the dynamic random access memory 10 referred to in the prior art and will not be described in detail here.

Referring to FIG. 2, after the capacitor 108 is completed, as mentioned in the prior art, the upper electrode 108c of the capacitor 108 has a rough surface 109 (or in other embodiments, if a mask layer on the upper electrode is additionally formed, then the mask layer also has a rough surface). In this embodiment, a first insulating layer 130 is additionally and completely formed at least covering the rough surface 109 of the capacitor 108, and also covering the bottom corner area 124 disposed between the memory region 102 and the peripheral region 104. The first insulating layer 130 is preferably formed by atomic layer deposition (ALD) process. The first insulating layer 130 is used to repair the rough surface 109 of the electrode 108c of the capacitor 108. After the first insulating layer 130 is formed, the surface of the capacitor 108 (that is, the surface of the first insulating layer 130) becomes smoother. In this way, the additional stress to the dielectric layer (formed in the following steps) provided by the surface of the capacitor 108 can be reduced.

In this embodiment, the thickness of the first insulating layer 130 is preferably less than 500 angstroms, the material of the first insulating layer 130 includes such as silicon oxide or silicon nitride, but not limited thereto. Referring to FIG. 3, after the first insulating layer 130 is formed, a dielectric layer 120 is then formed on the substrate 100 and covers the first insulating layer 130. Next, at least one contact structure 122 is formed in the dielectric layer 120 and which is electrically connected to the second transistor 110 in the peripheral region 104. It should be noted that the dielectric layer 120 may include material such as tetraethyl orthosilicate (TEOS) with a thickness more than 1.5 micrometers. During the formation of the dielectric layer 120, the process temperature is preferably higher than 400° C., and the process temperature is then cooled to below than 40° C. after the dielectric layer 120 is formed. Therefore, if more stress applies to the dielectric layer 120, the cracking problem as mentioned in the prior art is easily to occur. However, in this embodiment, since the first insulating layer 130 has been formed on the rough surface 109 of the capacitor 108, the rough surface 109 of the capacitor 108 can be repaired while the first insulating layer 130 has a relatively smooth surface, the additional stress can be reduced effectively, and further reducing the cracking problem of the dielectric layer 120. And at the same time, the short-circuiting issue of the contact structure can be prevented effectively.

In addition, it is worth noting that the first insulating layer 130 not only covers the surface and the sidewalls of the capacitor 108, but also covers the second transistor 110 in the peripheral region 104, especially covers the bottom corner area 124 between the memory region 102 and the peripheral region 104. It has been mentioned in the prior art that the additional stress is liable to be generated at the interface between the different regions due to different components. Therefore, the bottom corner area 124 is also covered by the first insulating layer 130, the first insulating layer 130 serves as a stress absorbing buffer layer, therefore the influencing of the dielectric layer 120 can be reduced.

Figure 4:
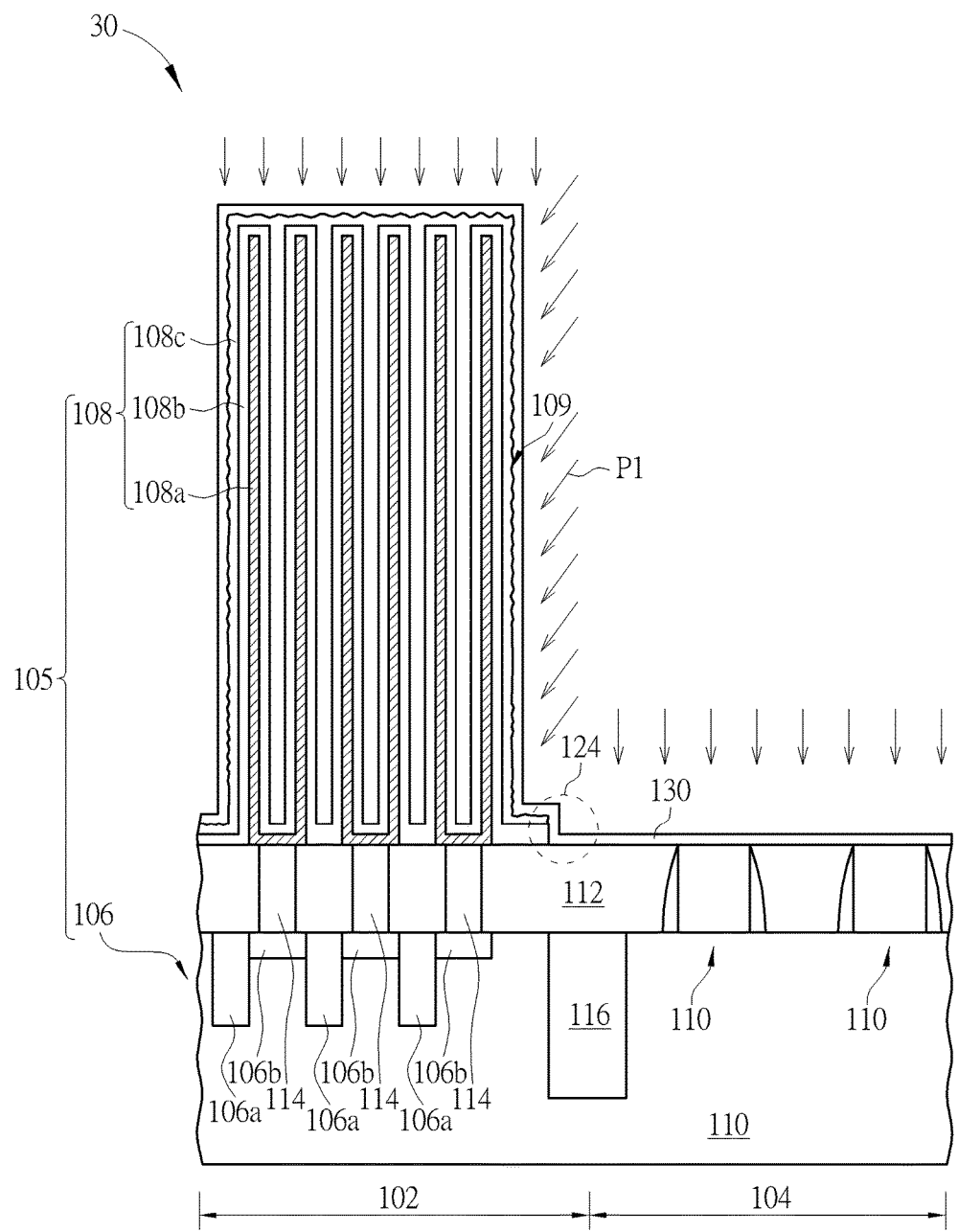
FIG. 4 and FIG. 5 show a schematic diagram of a DRAM according to a second preferred embodiment of the present invention at a boundary between a memory region and a peripheral region.

In another embodiment of the present invention, referring to FIG. 4, a dynamic random access memory 30 is provided. Please note that the dynamic random access memory 30 herein is based on the dynamic random access memory 10 mentioned in the prior art. Same elements are labeled as the same reference numbers. The substrate 100 includes a memory region 102 and a peripheral region 104 respectively. The memory region 102 includes at least one first transistor 106 and at least one capacitor 108. The peripheral region 104 includes at least one second transistor 110. The elements that are not mentioned here and in the following paragraphs are the same as the dynamic random access memory 10 referred to in the prior art and will not be described in detail here.

This embodiment is similar to the above first preferred embodiment. After the capacitor 108 is completed, the upper electrode 108c of the capacitor 108 has a rough surface 109 (or in other embodiments, if a mask layer is additionally formed on the upper electrode, the mask layer also has a rough surface). In this embodiment, a first insulating layer 130 is additionally and completely formed, at least covering the rough surface 109 of the capacitor 108, and also covering the bottom corner area 124 disposed between the memory region 102 and the peripheral region 104. Besides, except for forming the first insulating layer 130 to repair the rough surface 109, an ultraviolet (UV) curing process P1 is further performed to the first insulating layer 130, so as to increase a tensile stress of the first insulating layer 130. The temperature of the UV process P1 in this embodiment is between 400 and 600° C. In addition, the material of the first insulating layer 130 is preferably selected from materials having stress such as silicon nitride, boron nitride, silicon carbide and carbon silicon oxide.

Figure 5:
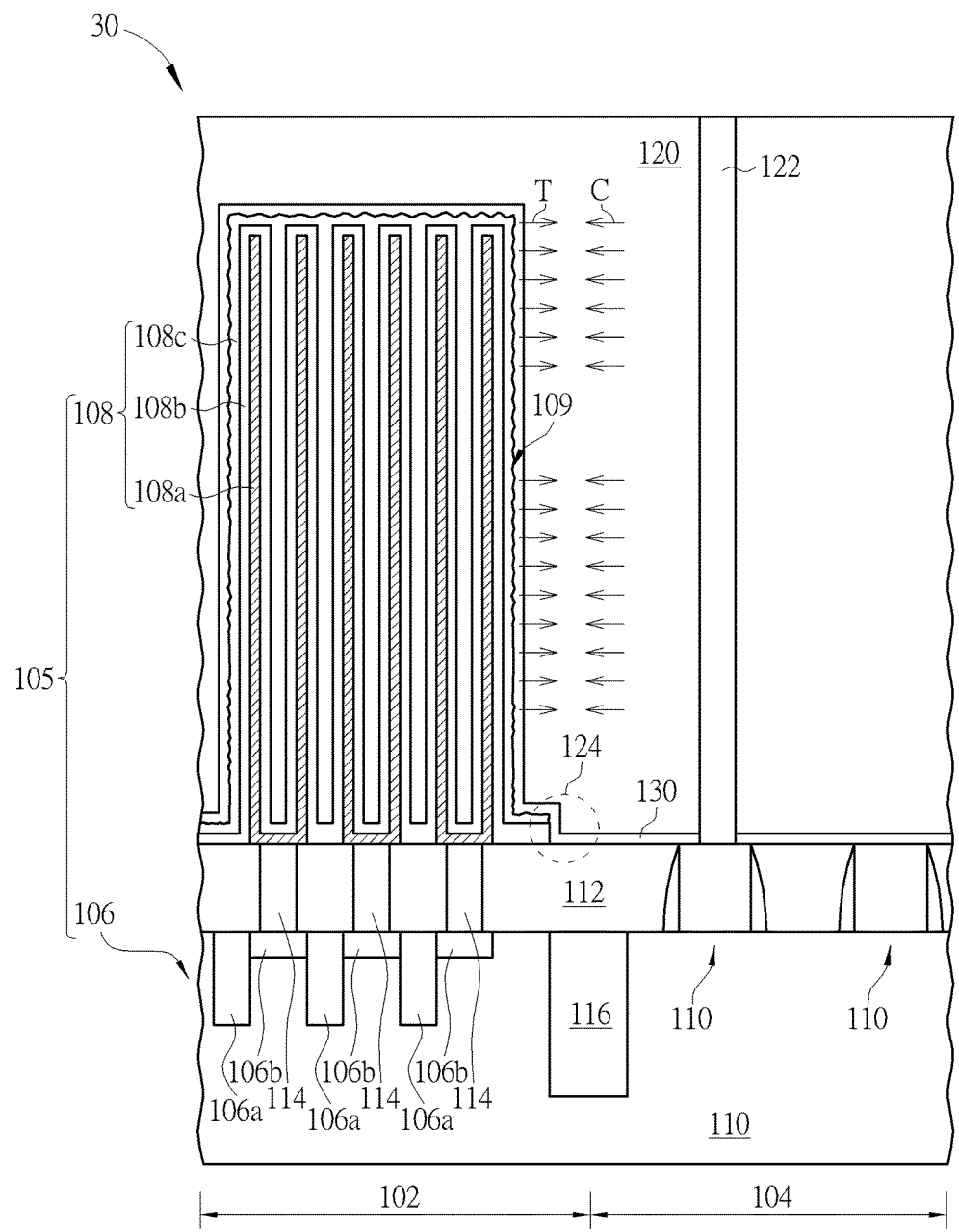

Referring to FIG. 5, after the first insulating layer 130 is formed and the UV curing process P1 is performed, a dielectric layer 120 is then formed on the substrate 100 and covers the first insulating layer 130. Next, at least one contact structure 122 is formed in the dielectric layer 120 and which is electrically connected to the second transistor 110 in the peripheral region 104. It should be noted that the dielectric layer 120 may include material such as tetraethyl orthosilicate (TEOS) with a thickness more than 1.5 micrometers. During the formation of the dielectric layer 120, the process temperature is about higher than 400° C., and the process temperature is then cooled to below than 40° C. after the dielectric layer 120 is performed. Applicants have found that after the above cooling step, the dielectric layer 120 has certain compressive stress (labeled as the arrows C shown in FIG. 5), which is also the reason for causing the dielectric layer 120 to be cracked. Therefore, in this embodiment, by performing the UV curing process P1 on the first insulating layer 130, after the UV curing process P1 is performed, the tensile stress of the first insulating layer 130 will be enhanced (labeled as the arrows T shown in FIG. 5), and therefore the tensile stress can be used to counteract the compressive stress of the dielectric layer 120. In this way, the cracking issue of the dielectric layer 120 and the short-circuiting issue of the contact structure 122 mentioned in the prior art can be effectively prevented.

In summary, one feature of the present invention is to provide some methods for resolving the problem of dielectric layer fragmentation in dynamic random access memory. One of the methods is to form the first insulating layer on the surface of the capacitor, so as to repair the rough surface of the capacitor and to reduce the extra stress generated by the rough surface. Alternatively, the first insulating layer is further subjected to an ultraviolet (UV) curing process to increase the tensile stress inherent in the first insulating layer itself and counteract the compressive stress of the dielectric layer. The above two methods can avoid excessive stress affecting the dielectric layer, reduce the fragmentation of the dielectric layer and further improve the DRAM process yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate, a memory region and a peripheral region are defined thereon, the memory region comprises a plurality of memory cells, each memory cell comprises at least a first transistor and a capacitor, the peripheral region comprises at least one second transistor;
   forming a first insulating layer within the memory region and the peripheral region by an atomic layer deposition (ALD) process, covering the capacitor of the memory cells in the memory region and the second transistor in the peripheral region;
   forming a second insulating layer, overlying the first insulating layer; and
   forming a contact structure in the second insulating layer within the peripheral region, the contact structure is electrically connected the second transistor.

2. The method of claim 1, wherein each of the capacitors comprises a rough surface, and the first insulating layer at least covers the rough surface.

3. The method of claim 1, wherein a boundary between the memory region and the peripheral region comprises a bottom corner area, and the first insulating layer at least covers the bottom corner area.

4. The method of claim 1, wherein a thickness of the first insulating layer is less than 500 angstroms.

5. The method of claim 1, wherein the second insulating layer has a thickness greater than 1.5 micrometers.

6. The method of claim 1, wherein the material of the first insulating layer comprises silicon oxide or silicon nitride.

7. The method of claim 1, wherein the material of the second insulating layer comprises tetraethyl orthosilicate (TEOS).

8. The method of claim 1, wherein in the process of forming the second insulating layer, the process temperature is higher than 400° C.

9. The method of claim 1, wherein after the second insulating layer is formed, the process temperature is below than 40° C.

10. A method for fabricating a semiconductor device, comprising:
    providing a substrate, a memory region and a peripheral region are defined thereon, the memory region comprises a plurality of memory cells, each memory cell comprises at least a first transistor and a capacitor, the peripheral region comprises at least one second transistor;
    forming a first insulating layer within the memory region and the peripheral region, covering the capacitor of the memory cells in the memory region and the second transistor in the peripheral region, wherein the first insulating layer contains tensile stress;
    forming a second insulating layer, overlying the first insulating layer, wherein the second insulating layer contains compressive stress; and
    forming a contact structure in the second insulating layer within the peripheral region, the contact structure is electrically connected the second transistor.

11. The method of claim 10, wherein each of the capacitors comprises a rough surface, and the first insulating layer at least covers the rough surface.

12. The method of claim 10, wherein a boundary between the memory region and the peripheral region comprises a bottom corner area, and the first insulating layer at least covers the bottom corner area.

13. The method of claim 10, wherein a thickness of the first insulating layer is less than 500 angstroms.

14. The method of claim 10, wherein the second insulating layer has a thickness greater than 1.5 micrometers.

15. The method of claim 10, wherein the material of the first insulating layer comprises silicon oxide or silicon nitride.

16. The method of claim 10, wherein the material of the second insulating layer comprises tetraethyl orthosilicate (TEOS).

17. The method of claim 10, wherein in the process of forming the second insulating layer, the process temperature is higher than 400° C.

18. The method of claim 10, wherein after the second insulating layer is formed, the process temperature is below than 40° C.

19. The method of claim 10, wherein after the first insulating layer is formed, further comprising performing a UV curing process to the first insulating layer so as to increase a tensile stress of the first insulating layer.

20. The method of claim 19, wherein the temperature of the UV curing process is between 400 and 600° C.

* * * * *